United States Patent [19]

Kosakowski

[11] 3,725,903

[45] Mar. 27, 1973

[54] SELF-CALIBRATING ANALOG TO DIGITAL CONVERTER

[75] Inventor: Henry R. Kosakowski, Denville, N.J.

[73] Assignee: The Bendix Corporation, Teterboro, N.J.

[22] Filed: Feb. 9, 1971

[21] Appl. No.: 113,872

[52] U.S. Cl. ......................340/347 AD, 340/347 NT

[51] Int. Cl. ..............................................H03k 13/20

[58] Field of Search..................340/347 AD, 347 NT

[56] References Cited

UNITED STATES PATENTS

| | | | |
|---|---|---|---|
| 3,436,756 | 4/1969 | Myers et al. | 340/347 AD |
| 2,963,697 | 12/1960 | Giel | 340/347 AD |
| 3,316,547 | 4/1967 | Ammann | 340/347 NT |
| 2,824,285 | 2/1958 | Hunt | 340/347 AD |

*Primary Examiner*—Maynard R. Wilbur
*Assistant Examiner*—Leo H. Boudreau
*Attorney*—Anthony F. Cuoco and Plante, Hartz, Smith & Thompson

[57] ABSTRACT

A self-calibrating analog to digital converter wherein, if the full scale reading of the converter is defined as X counts, the calibration formula takes the following form:

$$C_o = [C_s - C_1]\ [X/2\ (C_m - C_1)]\ - X/2;$$ wherein $C_o$ is the count of the calibrated output; $C_s$ is the count of the analog signal to be converted; $C_1$ is the count of the low scale calibration point; and $C_m$ is the count of the mid-scale calibration point.

11 Claims, 1 Drawing Figure

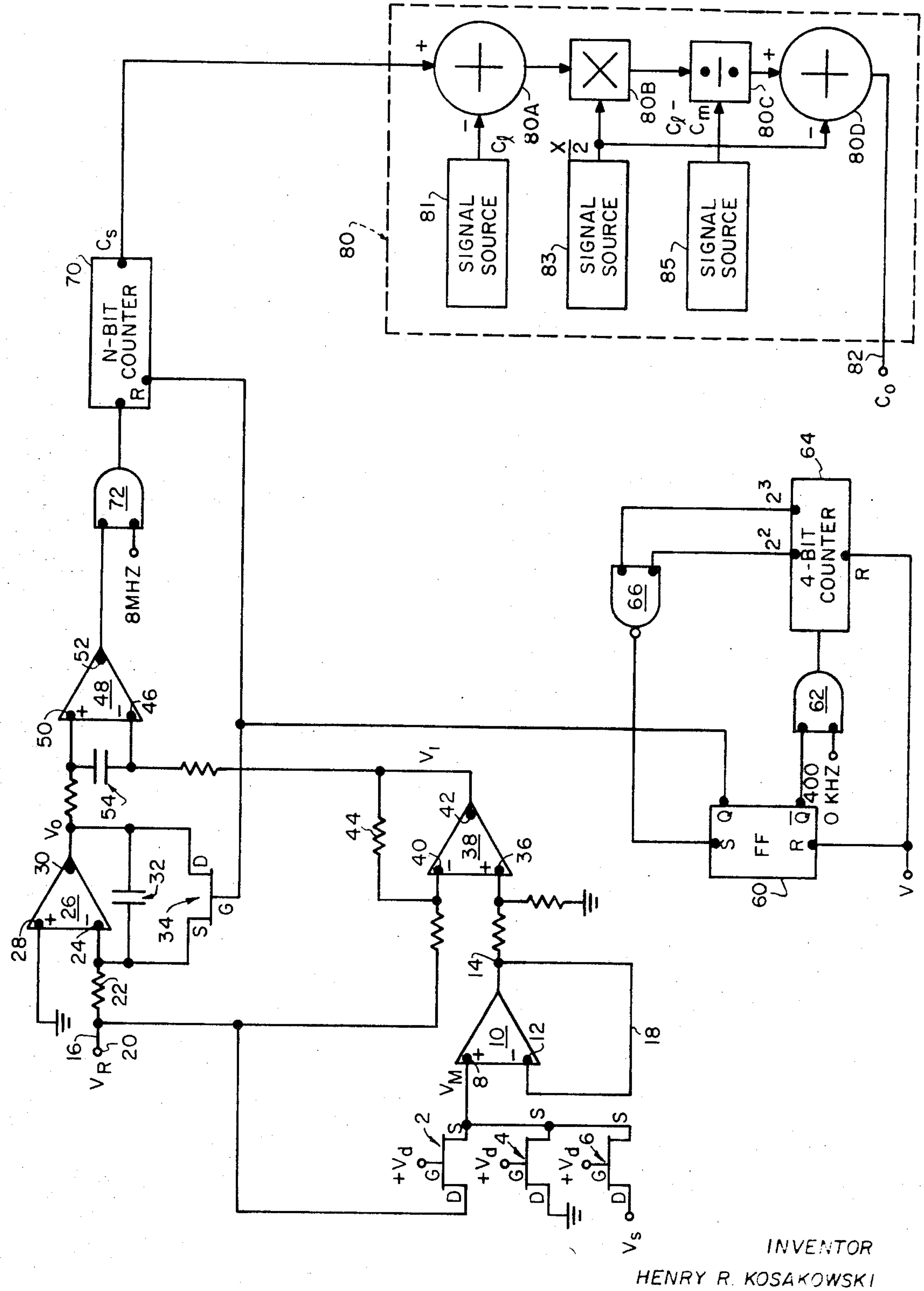
INVENTOR
HENRY R. KOSAKOWSKI
BY
Anthony J. Rossi
ATTORNEY

SELF-CALIBRATING ANALOG TO DIGITAL CONVERTER

BACKGROUND OF THE INVENTION

1. Field of the Invention

This invention relates generally to analog to digital (A/D) converters and, in particular, to A/D converters including self-calibrating means for providing an accurate conversion simply and inexpensively.

2. Description of the Prior Art

A/D converters now known in the art and having self-calibrating means require expensive precision type components in order to be effective. The apparatus of the present invention alleviates this disadvantage and accomplishes the conversion simply and economically. The accuracy of the conversion is that of a reference voltage and if all operating voltages are related to the reference voltage the error is minimized.

SUMMARY OF THE INVENTION

This invention contemplates an A/D converter wherein the analog signals to be converted are applied through multiplexer switches. An amplifier connected in voltage follower configuration provides isolation between the switches and the converter and a differential amplifier provides biasing for the voltage follower output. An amplifier connected in integrator configuration generates a ramp and a voltage comparator amplifier compares the ramp to the differential amplifier output. One counter sets the timing for the converter and another counter generates the digital information.

One object of this invention is to provide a self-calibrating A/D converter featuring maximum accuracy with minimum size, cost and power consumption.

Another object of this invention is to provide a converter of the type described wherein all operating voltages are related to a reference voltage so that the device operates with minimal conversion error.

Another object of this invention is to provide a converter of the type described wherein if the operating voltages are not related to the reference voltage the accuracy of the conversion is that of the reference voltage.

Another object of this invention is to provide a converter of the type described wherein the calibrated output has a sense automatically applied thereto.

The foregoing and other objects and advantages of the invention will appear more fully hereinafter from a consideration of the detailed description which follows, taken together with the accompanying drawing wherein one embodiment of the invention is illustrated by way of example. It is to be expressly understood, however, that the drawing is for illustration purposes only and is not to be construed as defining the limits of the invention.

DESCRIPTION OF THE DRAWING

The single FIGURE of the drawing is an electrical schematic-block diagram of the analog to digital converter including self-calibrating means constructed according to the invention.

DESCRIPTION OF THE INVENTION

Analog signals requiring the conversion are applied to the converter through multiplexer switches 2, 4, and 6, and which switches may be field effect transistors having gate (G) source (S) and drain (D) elements. For purposes of illustration, an analog signal $V_s$ which is to be converted to digital form is applied to drain element (D) of switch 6.

Source elements (S) of switches 2, 4, and 6 are connected to a non-inverting input terminal 8 of an amplifier 10 having an inverting input terminal 12 and an output terminal 14. A voltage $V_m$ is provided at source element (S) of switch 2. Gate elements (G) of switches 2, 4, and 6 are connected to sources of driving voltage $+V_d$. Drain element (D) of transistor 4 is connected to ground and drain element (D) of transistor 2 is connected to a converter input conductor 16.

A feedback conductor 18 is connected to output terminal 14 of amplifier 10 and to inverting input terminal 12 thereof so that amplifier 10 is, in effect, a voltage follower and thus provides isolation between switches 2, 4, and 6 and the converter of the system.

A reference signal $V_R$ is applied to a converter input terminal 20, and therefrom through input conductor 16 and a resistor 22 to an inverting input terminal 24 of an amplifier 26 having a non-inverting input terminal 28 connected to ground and an output terminal 30. A capacitor 32 is connected in feedback relation to inverting input terminal 24 and output terminal 30 of amplifier 26 for providing a conventional type analog integrator, so that a ramp voltage $V_o$ is provided at output terminal 30 of amplifier 26.

A switch 34 which may be a field effect transistor having gate source and drain elements (G), (S), and (D), respectively, has source element S connected to inverting input terminal 24 and drain element D connected to output terminal 30 of amplifier 26, and is thus connected across integrator capacitor 32.

Output terminal 14 of amplifier 10 is connected to a grounded non-inverting input terminal 36 of a differential amplifier 38 having an inverting input terminal 40 connected to input conductor 16 and an output terminal 42. A resistor 44 is connected in feedback relation to inverting input terminal 40 and to output terminal 42 of differential amplifier 38. Amplifier 38 is effective for biasing the output from amplifier 10 applied to non-inverting input terminal 36 of amplifier 38 from, for example, ±5 volt level to a 0–10 volt level (for $V_R = -5$ volts).

Output terminal 42 of amplifier 38, at which a voltage $V_1$ is provided, is connected to a non-inverting input terminal 46 of a high speed voltage comparator amplifier 48 having an inverting input terminal 50 connected to output terminal 30 of integrator amplifier 26 and an output terminal 52. A capacitor 54 is connected across non-inverting and inverting input terminals 46 and 50, respectively, of amplifier 48.

A converter start pulse V is applied to a reset terminal (R) of a conventional logic type flip-flop 60. Flip-flop 60 has a set terminal (S) and provides (Q) and complementary ($\overline{Q}$) outputs as is well known in the art.

The ($\overline{Q}$) output from flip-flop 60 is applied to an input of an AND gate 62 and a clock signal which may be, for example, a 400 khz signal is applied to another input of AND gate 62 and to reset terminal (R) of flip-flop 60. The output of AND gate 62 enables a 4 bit counter 64, and which counter is reset by start pulse V applied to a reset terminal (R) of the counter. The outputs ($2^2$ and $2^3$) from counter 64 are applied to an inverting AND or NAND gate 66. The output from NAND gate 66 is applied to set terminal S of flip-flop 60.

The Q output from flip-flop 60 is connected to gate element (G) of switch 34 and to a reset terminal (R) of an N bit counter 70. The output from comparator amplifier 48 at output terminal 52 is applied to an input of an AND gate 72 and a clock pulse which may be, for example, an 8 mhz pulse, is applied to another input of AND gate 72. The output of AND gate 72 enables counter 70 to provide digital outputs corresponding to the count of signal analog signal $V_s$.

The output from counter 70 is applied to a summing device 80A included in a computer 80. Computer 80 further including a multiplying device 80B, a dividing device 80C and another summing device 80D. Computer 80 with associated arithmetic devices 80A–80D is of a type well known in the art such as described at pages 338–342 in Pulse, Digital and Switching Waveforms, Millman and Taub, McGraw Hill, 1965.

A digital signal corresponding to the low scale calibration point ($C_1$) of the converter and provided by a signal source 81 is applied to summing means 80A which sums the digital signal with digital output $C_s$ from counter 70.

The output from summing means 80A is applied to multiplying device 80B whereby the output is multiplied by a signal corresponding to one-half of the full scale reading of the converter (X/2) and provided by a signal source 83, and where, as heretofore noted, the full scale reading of the A/D converter is X counts.

The output from multiplying device 80B is applied to dividing device 80C where it is divided by a signal corresponding to the difference between the low and mid-scale calibration points ($C_m - C_1$) of the converter and provided by a signal source 85.

The output from dividing device 80C is applied to summing device 80D and summed with the signal from source 83 (X/2) to provide at an output conductor 82 a calibrated digital output $C_o$.

OPERATION OF THE INVENTION

The analog to digital conversion begins when start pulse V resets flip-flop 60. The output from the flip-flop turns on or renders switch 34 conductive, enables counter 64 and holds counter 70 in the reset position. Switch 34 discharges capacitor 32 thereby causing the output of amplifier 48 to become a logic "1." A count of 12 ($2^2$, $2^3$) is decoded from counter 64 and sets, through gate 66, flip-flop 60. The setting of flip-flop 60 turns off or renders switch 34 non-conductive, allowing integrator amplifier 26 to generate a positive going ramp output $V_O$. Ramp output $V_O$ is provided in accordance with the following:

$$V_O = V_R t/(R_{22} C_{32}) \quad (1)$$

where $V_O$ is a function of time $t$.

Setting flip-flop 60 also removes the reset signal from counter 70 allowing the counter to count at the 8 mhz rate. Counting continues until comparator amplifier 48 is switched to a logic "0" by ramp voltage $V_O$ exceeding voltage $V_1$ provided by amplifier 38.

At the time of the comparator transition, the numbers stored in counter 70 are related to voltage $V_1$. The exact relationship between the binary number in counter 70 and voltage $V_s$ which is to be converted to digital form is a function of the accuracy of $V_R$, $R_{22}$ and $C_{34}$, and the various offset voltages and gains of amplifiers 10, 26, 38 and 48.

It will now be shown that all errors except those associated with reference voltage $V_R$ can be eliminated if a calibration formula is applied to the converted output. In order to accomplish this the conversion of two known signals; ground, which because of the biasing performed by amplifier 38 contributes a mid-scale calibration count ($C_m$), and $V_R$ which supplies the low scale calibration count ($C_l$). Considering, as heretofore noted, that the full scale reading of the A/D converter is defined as X counts, the calibration formula takes the following form:

$$C_O = [C_s - C_l]\,[X/2\,(C_m - C_1)] - (X/2)\,. \quad (2)$$

Assuming that the d. c. leakage of capacitor 32 is negligible the d. c. leakages of switches 2, 4, 6 and 34 are neglible, the variations in the 8 mhz clock pulse contribute neglible error and noting the ensuing definitions, the following analysis is applicable:

$t$ = time
$V_1$ = Voltage output from summing amplifier (amplifier 38)
$V_M$ = Voltage input to multiplexer (amplifier 10)
$V_R$ = Integrator Reference Voltage
$V_S$ = Voltage to be Converted
$e_i$ = Offset Voltage of Integrator (amplifier 26)
$e_M$ = Offset Voltage of Multiplexer
$e_S$ = Offset Voltage of Summing Amplifier (amplifier 38)
$e_C$ = Offset Voltage of Comparator (amplifier 48)
$X$ = Gain of Positive Leg of Summing Amplifier
$Y$ = Gain of Negative Leg of Summing Amplifier
$C_O$ = Calibrated Output $$V_1 = (V_M + e_M)\,X - (V_R + e_S)\,Y\,;$$

$$V_O = -[(V_R t/R_{22}\,C_{32}) + e_i]\,. \quad (3)$$

At the end of the conversion $$V_1 = V_O + e_C$$

$$(V_M + e_M)\,X - (V_R + e_S)\,Y = -(V_R t)/R_{22}C_{32} - e_i + e_C;$$

Solving for t $t = (X\,V_M R_{22} C_{32})/V_R + Y R_{22} C_{32} - (X_l - Y_e + e_i - e_C)/V_R\ R_{22}\,C_{32};$ Let $$Q = \frac{(X_{e_M} - X_{e_S} + e_i - e_C)}{V_R}\,V_R\,R_{22} C_{32} + Y R_{22}\,C_{32};$$

$$t = (X V_M R_{22} C_{32})/V_R + Q\,. \quad (4)$$

Counts $= X\,10^6\,t$

From equation 2:

$$C_o = [C_s - C_l][X/2\,(C_m - C_l)] - (X/2);\ C_o = [t_s - t_1]\,[4{,}000/2\,(t_m - t_1)] - (X/2)$$

Let $V_M$ successively take on the values of all analog signal inputs, i. e. $V_S$, $V_L$, $V_m$:

$$C_o=](-XV_sR_{22}C_{32})/VR+Q-(-XV_LR_{22}C_{32})/VR+Q].$$

$$\left[\frac{X/2}{\frac{(-XV_mR_{22}C_{32})}{V_R}+Q-\frac{(-XV_LR_{22}C_{32})}{V_R}}+Q\right]-X/2$$

For $V_L=V_R$ and $V_m=0$;

$$C_O=\left[\frac{-XV_SR_{22}C_{32}}{V_R}+XR_{22}C_{32}\right]\left[\frac{X/2}{XR_{22}C_{32}}\right]-X/2$$

$$C_O=\left[\frac{-V_S}{V_R}+1\right]\left[X/2\right]-X/2$$

$$C_O=\frac{-XV_S}{2V_R} \quad (7)$$

Therefore, the final calibrated output of the converter is independent of all errors except those associated with the reference voltage $V_R$. Furthermore all errors due to $V_R$ can also be eliminated if all signal voltages are derived from $V_R$.

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. A system including a self-calibrating converter for converting an analog input signal from a signal source to a digital output signal, comprising:
- means for providing a reference signal;
- means for providing a signal at ground level;
- multiplexer means connected to the signal source, to the reference signal means and to the ground level signal means for applying the signals therefrom to the converter;
- difference means connected to the reference signal means and to the multiplexer means for providing a signal corresponding to the difference between the signals therefrom;
- integrator means connected to the reference signal means for integrating the signal therefrom;
- comparator means connected to the integrator means and to the difference means for comparing the signals therefrom for providing a signal in accordance with said comparison;
- counting means connected to the comparator for providing the digital output signal in response to the comparison signal; and
- calibrating means connected to the counter for providing a calibrated digital output signal having a mid-scale calibration point in accordance with the ground level signal and a low-scale calibration point in accordance with the reference signal.

2. A system as described by claim 1, wherein the multiplexer means includes:
- first switching means connected to the signal source, second switching means connected to the ground level signal means and third switching means connected to the reference signal means; and
- amplifier means connected to the first, second and third switching means for isolating said switching means from the converter.

3. A system as described by claim 2, wherein the switching means includes:
- a voltage source for providing a driving voltage;
- a first current flow control device having an input element connected to the reference signal means, a control element connected to the voltage source and an output element connected to the amplifier means;
- a second current flow control device having a grounded input element, a control element connected to the voltage source and an output element connected to the amplifier means; and
- a third current flow control device having an input element connected to the signal source, a control element connected to the voltage source and an output element connected to the amplifier means.

4. A system as described by claim 3, wherein:
- the amplifier means has an inverting input element, a non-inverting input element and an output element;
- the inverting input element is connected to the output element; and
- the output elements of the first, second and third current flow control devices are connected to the non-inverting input element of the amplifier.

5. A system as described by claim 1, wherein the difference means includes:
- an amplifier having an inverting input element connected to the reference signal means, a grounded non-inverting input element connected to the multiplexer and an output element; and
- a resistor connected to the output element and to the inverting input element of the amplifier.

6. A system as described by claim 1, wherein the integrator means includes:
- an amplifier having an inverting input element connected to the reference signal means, a grounded non-inverting input element and an output element connected to the comparator means;
- a capacitor connected to the inverting input element and to the output element of the amplifier; and
- a switch connected across the capacitor.

7. A system as described by claim 1, wherein the comparator means includes:
- an amplifier having an inverting input element connected to the integrating means, a non-inverting input element connected to the difference means and an output element; and
- a capacitor connected to the inverting and non-inverting input elements of the amplifier.

8. A system as described by claim 1, wherein the counting means includes:
- means for providing a timing pulse;
- gating means having a first input element connected to the comparator means, a second input element connected to the timing pulse means and an output element at which a signal is provided when the comparison signal and the timing pulse are present; and
- an N-bit counter connected to the gating means so as to be enabled by the signal therefrom.

9. A system as described by claim 6, including timing means, comprising:
- means for providing a starting signal;
- means for providing a timing pulse;

an oscillator connected to the starting signal means and reset by the signal therefrom for providing an output at one logic level;

counting means connected to the oscillator and to the timing pulse means and responsive to the timing pulse and the oscillator output at the one logic level for affecting the oscillator to provide an output at a complementary logic level;

the integrator switch connected to the oscillator and affected by the oscillator output at the one and complementary logic levels for alternately charging and discharging the capacitor to affect the integrator amplifier for providing a ramp output.

10. A system as described by claim 9, wherein:

the oscillator is connected to the counting means so that said counting means is reset in response to the output at the one logic level.

11. A system as described by claim 1, wherein the counting means provides a digital signal ($C_s$), and the calibrating means comprises:

first means for providing a digital signal ($C_l$) corresponding to a low scale calibration point;

second means for providing a digital signal (X/2) corresponding to one-half of the full scale reading of the converter;

third means for providing a digital signal ($C_l - C_m$) corresponding to the difference between the low scale calibration point ($C_l$) and a mid-scale calibration point ($C_m$);

means connected to counting means and to the first means for summing the digital signals therefrom;

means connected to the summing means and to the second means for multiplying the signals therefrom;

means connected to the multiplying means and to the third means for dividing the signals therefrom;

means connected to the dividing means and to the second means for summing the signals therefrom; and said last mentioned summing means providing a calibrated output $C_o$, wherein $C_o = [C_s - C_l][X/2(C_m - C_l)] - (X/2)$.

* * * * *

UNITED STATES PATENT OFFICE

CERTIFICATE OF CORRECTION

Patent No. 3,725,903 Dated April 3, 1973

Inventor(s) HENRY R. KOSAKOWSKI

It is certified that error appears in the above-identified patent and that said Letters Patent are hereby corrected as shown below:

On the cover sheet [45], "Mar. 27, 1973" should read -- Apr. 3, 1973 --.

Signed and sealed this 20th day of November 1973.

(SEAL)
Attest:

EDWARD M.FLETCHER,JR.
Attesting Officer

RENE D. TEGTMEYER
Acting Commissioner of Patents